(12) United States Patent
Fujiwara

(10) Patent No.: US 9,323,201 B2
(45) Date of Patent: Apr. 26, 2016

(54) SHEET PROCESSING APPARATUS HAVING HINGE

(71) Applicant: BROTHER KOGYO KABUSHIKI KAISHA, Nagoya-shi, Aichi-ken (JP)

(72) Inventor: Takashi Fujiwara, Nagakute (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 14/576,886

(22) Filed: Dec. 19, 2014

(65) Prior Publication Data

US 2015/0189778 A1 Jul. 2, 2015

(30) Foreign Application Priority Data

Dec. 27, 2013 (JP) ................................. 2013-271246

(51) Int. Cl.
G03G 21/16 (2006.01)
G03G 15/00 (2006.01)
H04N 1/00 (2006.01)
E05D 11/00 (2006.01)
H05K 5/02 (2006.01)

(52) U.S. Cl.
CPC .......... *G03G 15/605* (2013.01); *E05D 11/0081* (2013.01); *G03G 21/1652* (2013.01); *H04N 1/00554* (2013.01); *H05K 5/0226* (2013.01)

(58) Field of Classification Search
CPC ..... H05K 5/0226; H05K 5/0247; H02B 1/38; G03G 21/1652; G03G 2221/166; H04N 1/00554; H04N 1/00557; E05K 11/0081
See application file for complete search history.

(56) References Cited

U.S. PATENT DOCUMENTS

| 7,457,910 | B2 * | 11/2008 | Chang et al. ................... 711/103 |
| 7,855,814 | B2 * | 12/2010 | Osakabe et al. ............... 358/474 |
| 2011/0026204 | A1 * | 2/2011 | Yang ........................ 361/679.01 |
| 2011/0075226 | A1 * | 3/2011 | Fujiwara ...................... 358/474 |
| 2011/0235082 | A1 | 9/2011 | Mukai |

FOREIGN PATENT DOCUMENTS

| JP | 2002-199156 A | 7/2002 |
| JP | 2011-077874 A | 4/2011 |
| JP | 5003781 B2 | 8/2012 |

* cited by examiner

*Primary Examiner* — Daniel J Colilla
*Assistant Examiner* — Justin Olamit
(74) *Attorney, Agent, or Firm* — Merchant & Gould P.C.

(57) ABSTRACT

A sheet processing apparatus includes: a main body accommodating a controller; an opening and closing member including an electrical part and pivotable about a pivot axis with respect to the main body between a closed position and an open position is exposed; a hinge disposed between the main body and the opening and closing member and at least partly constituting the pivot axis; and a flexible cable connecting between the electrical part and the controller. The opening and closing member includes a side wall for covering the electrical part from a hinge side of the electrical part. The side wall has an opening formed at a position opposite the flexible cable extending from the opening and closing member to the main body. The hinge includes a cover portion configured to cover a portion of the flexible cable which is exposed through the opening.

12 Claims, 10 Drawing Sheets

SHEET PROCESSING APPARATUS HAVING HINGE

CROSS REFERENCE TO RELATED APPLICATION

The present application claims priority from Japanese Patent Application No. 2013-271246, which was filed on Dec. 27, 2013, the disclosure of which is herein incorporated by reference in its entirety.

BACKGROUND

1. Technical Field

The following disclosure relates to a sheet processing apparatus.

2. Description of the Related Art

There has been known an image reading apparatus including a reading device configured to read an image formed on a sheet. This image reading apparatus includes a main body, an opening and closing member, a hinge, and a cable. The main body stores a controller configured to execute various processings for the reading device. The opening and closing member stores various devices and components including a conveying device for conveying a sheet and a reading device for reading an image formed on the sheet conveyed by the conveying device. The opening and closing member is pivotable with respect to the main body about a particular pivot axis. An upper surface of the main body serves as a document support surface on which a sheet is to be placed. The reading device reads an image formed on the sheet placed on this document support surface. The opening and closing member is movable between a closed position at which the opening and closing member covers the upper surface, i.e., the document support surface, of the main body and an open position at which the upper surface, i.e., the document support surface, is exposed. The hinge is provided between the main body and the opening and closing member. The hinge constitutes a pivot axis. Also, the opening and closing member includes a cable for transmitting image data from the reading device to the controller provided in the main body. The cable extends from the interior of the opening and closing member and is connected to the controller provided in the main body.

SUMMARY

In such an image reading apparatus, however, the cable extending from the opening and closing member is exposed, so that other components and the like easily contact the cable, leading to damage to the cable.

The hinge of the opening and closing member of the image reading apparatus is typically movable in the up and down direction for allowing placement of a relatively thick document such as a book on the document support surface. Thus, the cable has flexibility such that the cable can follow the upward and downward movement of the opening and closing member. If the cable is exposed to the outside in a bent state, when the opening and closing member is moved between the open position and the closed position, the cable may be pressed frontward by a rear wall of the opening and closing member. In this case, the cable is nipped between the opening and closing member and the main body, leading to damage to the cable.

Accordingly, an aspect of the disclosure relates to a sheet processing apparatus allowing satisfactory opening and closing operations of an opening and closing member while preventing damage to a flexible cable extending between the opening and closing member and a main body.

In one aspect of the disclosure, a sheet processing apparatus including: a main body accommodating a controller configured to execute a processing for a sheet; an opening and closing member including an electrical part for the processing and pivotable about a pivot axis with respect to the main body between a closed position at which an upper surface of the main body is covered with the opening and closing member and an open position at which the upper surface of the main body is exposed; a hinge disposed between the main body and the opening and closing member and at least partly constituting the pivot axis; and a flexible cable connecting between the electrical part provided in the opening and closing member and the controller provided in the main body. The opening and closing member includes a side wall for covering the electrical part from a hinge side of the electrical part. The side wall has an opening formed at a position opposite the flexible cable extending from the opening and closing member to the main body. The hinge includes a cover portion configured to cover a portion of the flexible cable which is exposed through the opening.

BRIEF DESCRIPTION OF THE DRAWINGS

The objects, features, advantages, and technical and industrial significance of the present disclosure will be better understood by reading the following detailed description of the embodiments, when considered in connection with the accompanying drawings, in which.

DETAILED DESCRIPTION OF THE EMBODIMENTS

Hereinafter, there will be described first and second embodiments of the present disclosure by reference to the drawings.

First Embodiment

Figure 1:
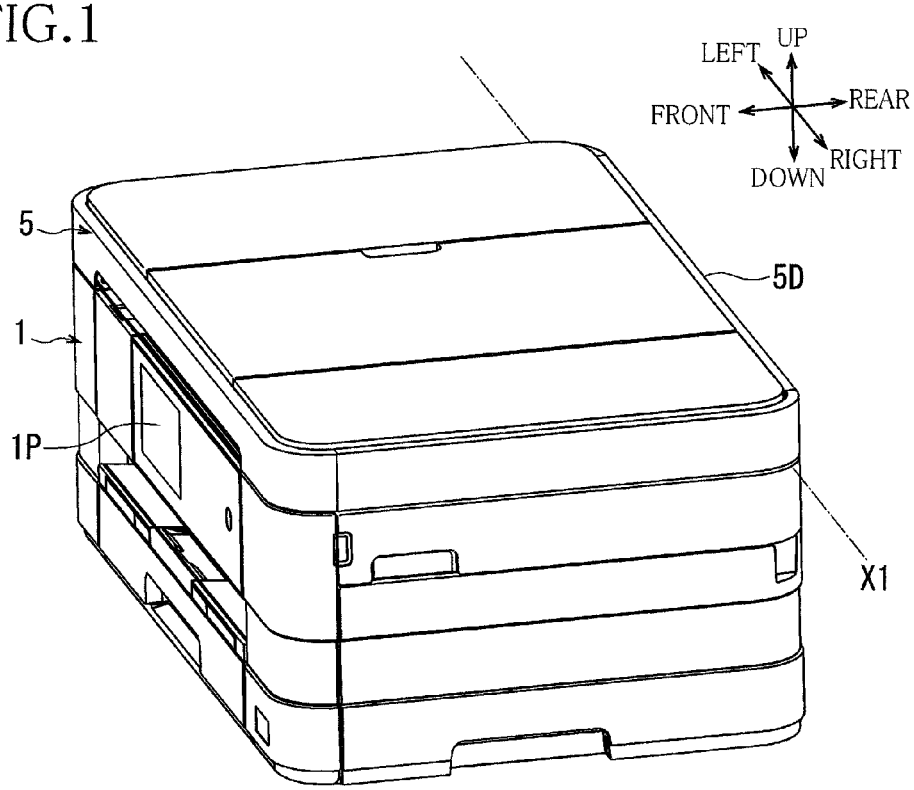
FIG. 1 is a perspective view of a multi-function peripheral (MFP) according to a first embodiment.

A multi-function peripheral (MFP) according to the first embodiment is one example of a sheet processing apparatus. In FIG. 1, a side of the MFP on which an operation panel 1P is provided is defined as a front side, and the other sides and front, rear, left, right, up, and down directions are defined assuming the MFP is viewed from the front side. This applies to the other figures.

Overall Construction

As illustrated in FIGS. 1-4, this MFP includes a main body 1, a first reading unit 3, an opening and closing member 5, a second reading unit 6, a conveying unit 7, an image forming unit 9, and first and second hinges 11, 13. The main body 1 is shaped like a box. The main body 1 includes the operation panel 1P, e.g., a touch panel on its front surface.

A platen glass 16 is disposed on the upper surface of the main body 1. An upper surface of the platen glass 16 serves as a document support surface 16A for supporting a document to be read. Examples of a document include a sheet (e.g., a paper sheet and an OHP sheet) and a book.

The first reading unit 3 is stored in an upper portion of the main body 1. The first reading unit 3 includes a contact image sensor (CIS) disposed under the document support surface 16A and a scanning mechanism for reciprocating the CIS in the right and left direction in the main body 1.

The opening and closing member 5 stores a conveying device configured to convey a document for its reading. Though not explained in detail, the conveying device includes conveying rollers, pinch rollers, and guides for guiding the document. Provided in the opening and closing member 5 are: the second reading unit 6 configured to read an image formed on the document conveyed by the conveying device; a motor 8 for driving the conveying device; and so on. The second reading unit 6 is a CIS extending in the front and rear direction that is perpendicular to a sheet conveying direction in which sheets are sequentially conveyed by the conveying device. It is noted that each of the second reading unit 6 and the motor 8 is one example of an electrical part. A flexible flat cable (FFC) 55 which will be described below is connected to the second reading unit 6, and a lead wire, not shown, for power supply and install of the motor 8. In the first embodiment, each of the FFC and the lead wire is a flexible cable. The following explanation is provided assuming the FFC 55 as the flexible cable.

Figure 3:
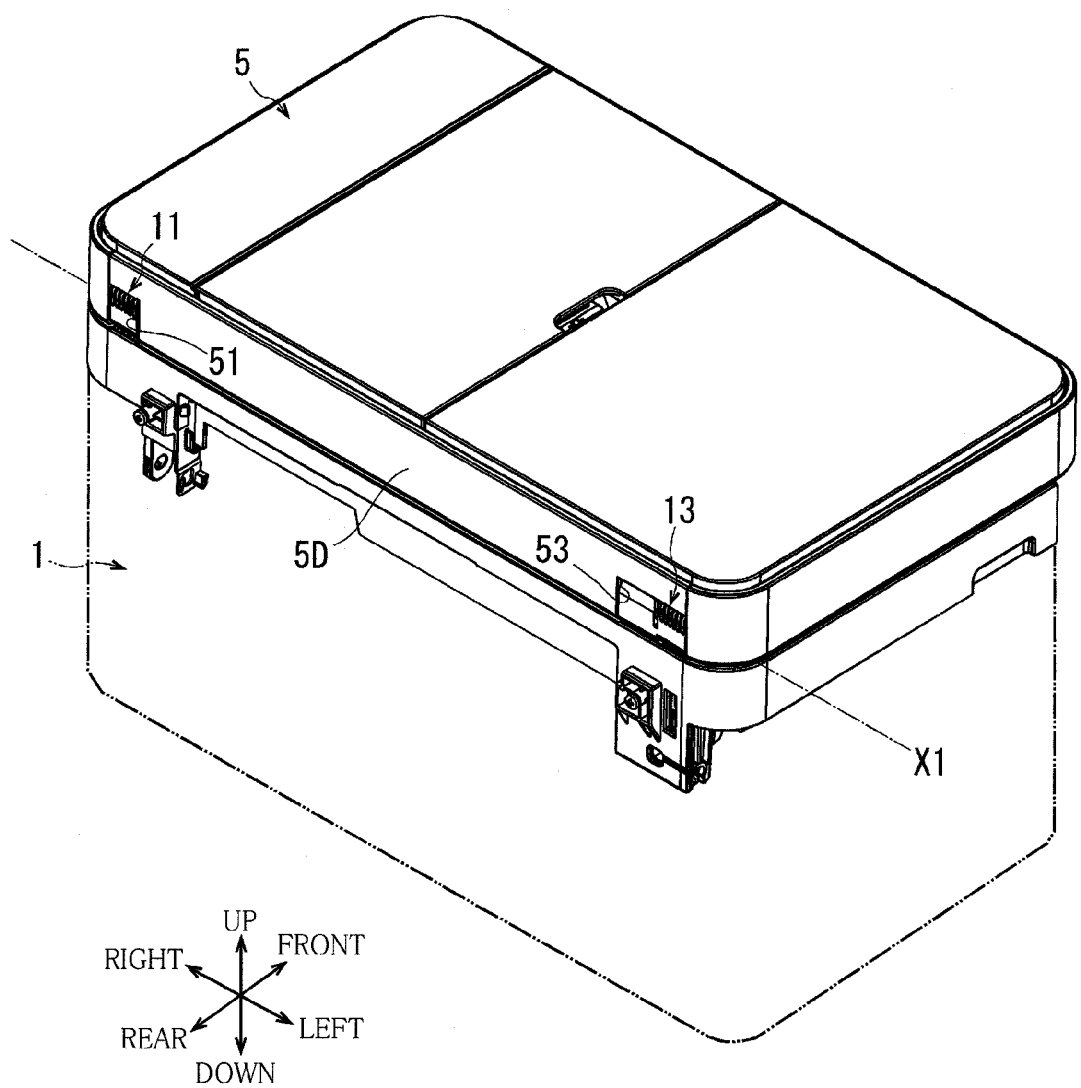
FIG. 3 is a rear perspective view of the MFP according to the first embodiment, with an opening and closing member located at a closed position.
Figure 4:
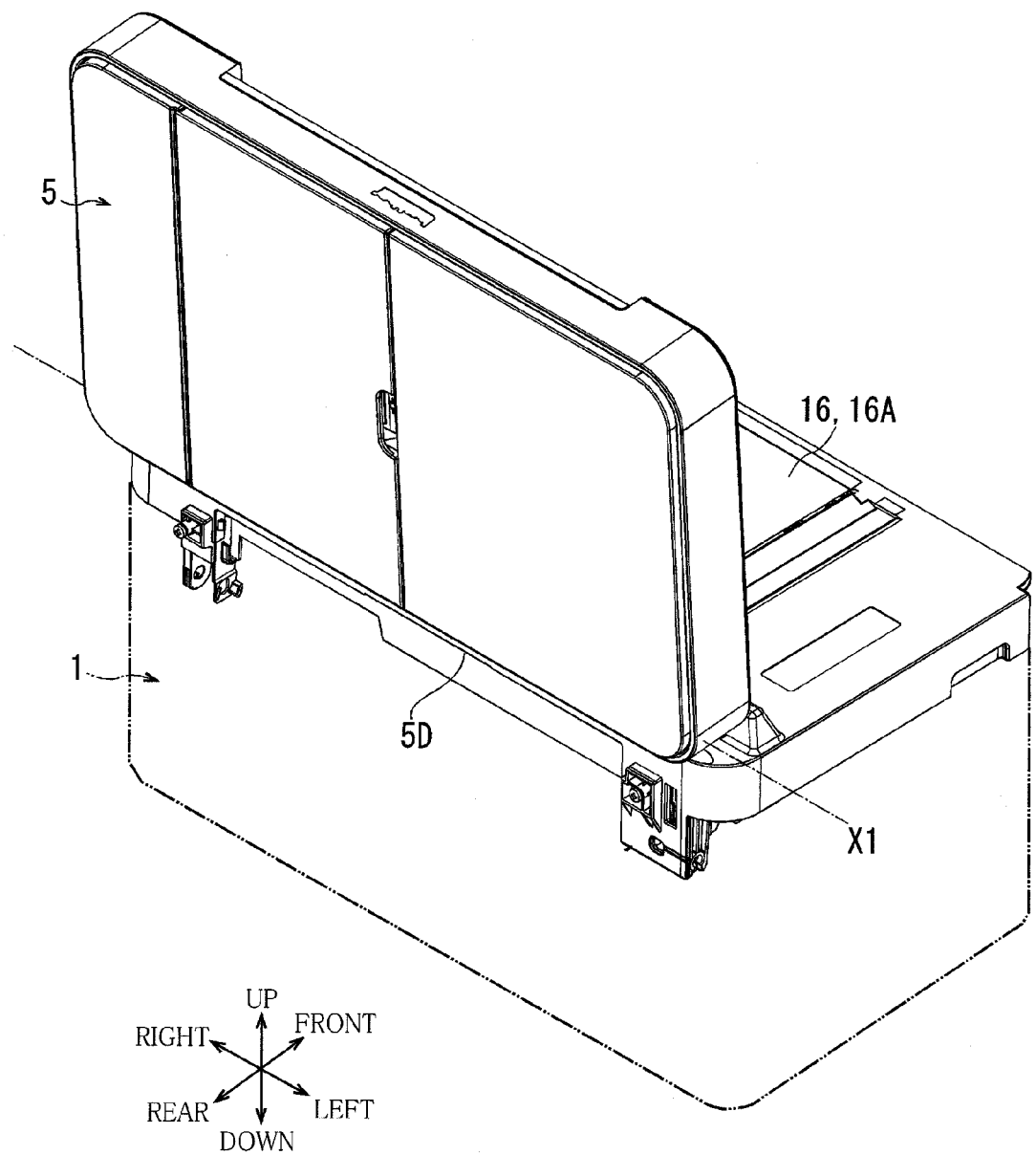
FIG. 4 is a rear perspective view of the MFP according to the first embodiment, with the opening and closing member located at an open position.

As illustrated in FIGS. 3 and 4, the first and second hinges 11, 13 each constituting a pivot axis X1 are provided between the main body 1 and the opening and closing member 5. The opening and closing member 5 is supported by the main body 1 using the first and second hinges 11, 13 so as to be pivotable about the pivot axis X1. The pivot axis X1 extends in parallel with a reference edge 16B as a rear edge of the document support surface 16A.

Figure 7A:
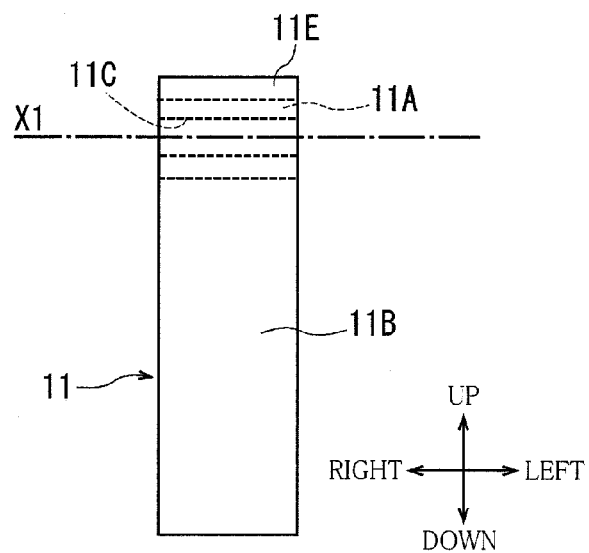
FIG. 7A is a rear view of a first hinge in the MFP according to the first embodiment.
Figure 7B:
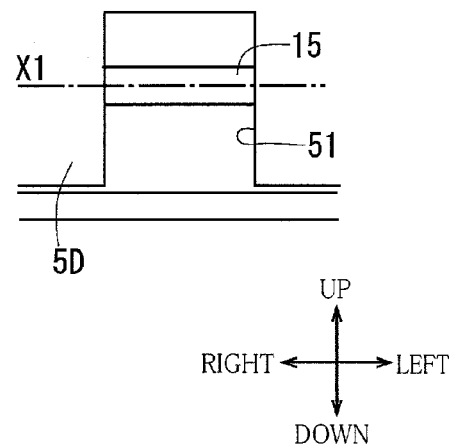
FIG. 7B is a rear view illustrating components of the opening and closing member near an opening.
Figure 9:
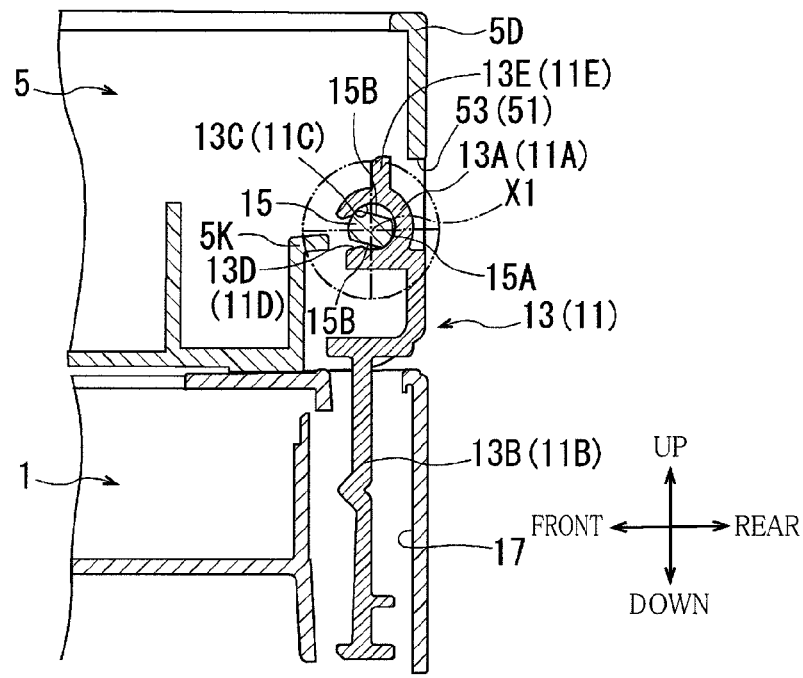
FIG. 9 is a cross-sectional view illustrating the second hinge and components therearound in the state in which the opening and closing member is located at the closed position in the MFP according to the first embodiment.
Figure 11:
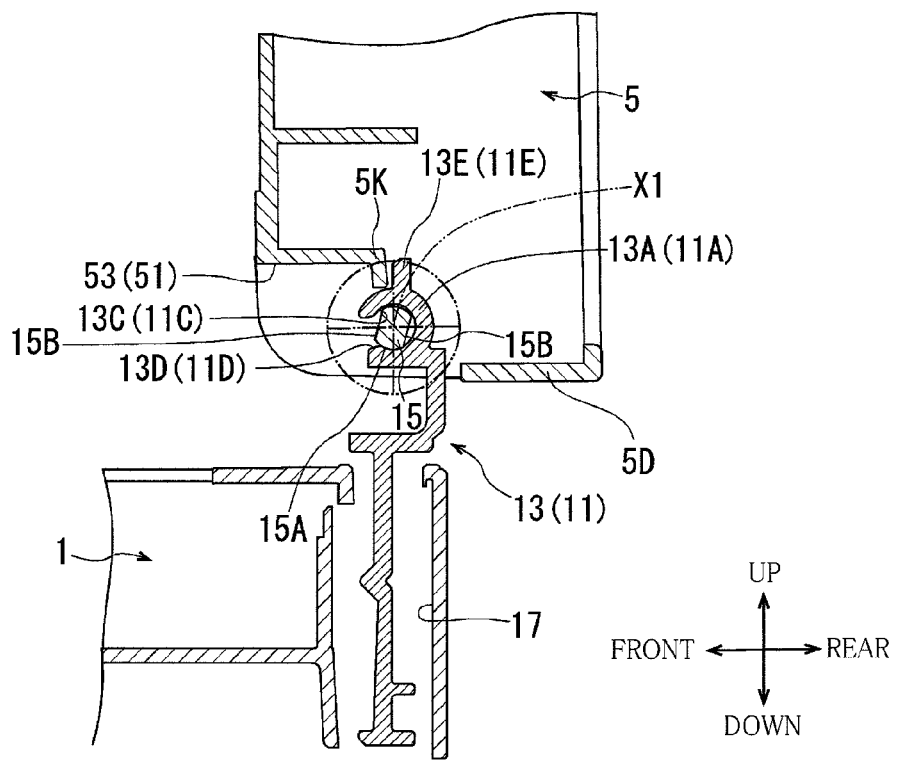
FIG. 11 is a cross-sectional view illustrating the second hinge and the components therearound in the state in which the opening and closing member is located at the open position in the MFP according to the first embodiment.

As illustrated in FIGS. 7, 9, and 11, the first hinge 11 includes a shaft supporter 11A, a base portion 11B formed integrally with the shaft supporter 11A, and a shaft member 15 which will be described below. The shaft supporter 11A has a cylindrical inner peripheral surface 11C whose central axis coincides with the pivot axis X1. The shaft supporter 11A has a cutout 11D formed parallel with the pivot axis X1 for exposing the inner peripheral surface 11C to the outside. Formed on an outer circumferential surface of the shaft supporter 11A is a contact wall 11E extending in a direction parallel with the pivot axis X1 and in a direction opposite to a direction that the base portion 11B extends.

Figure 5:
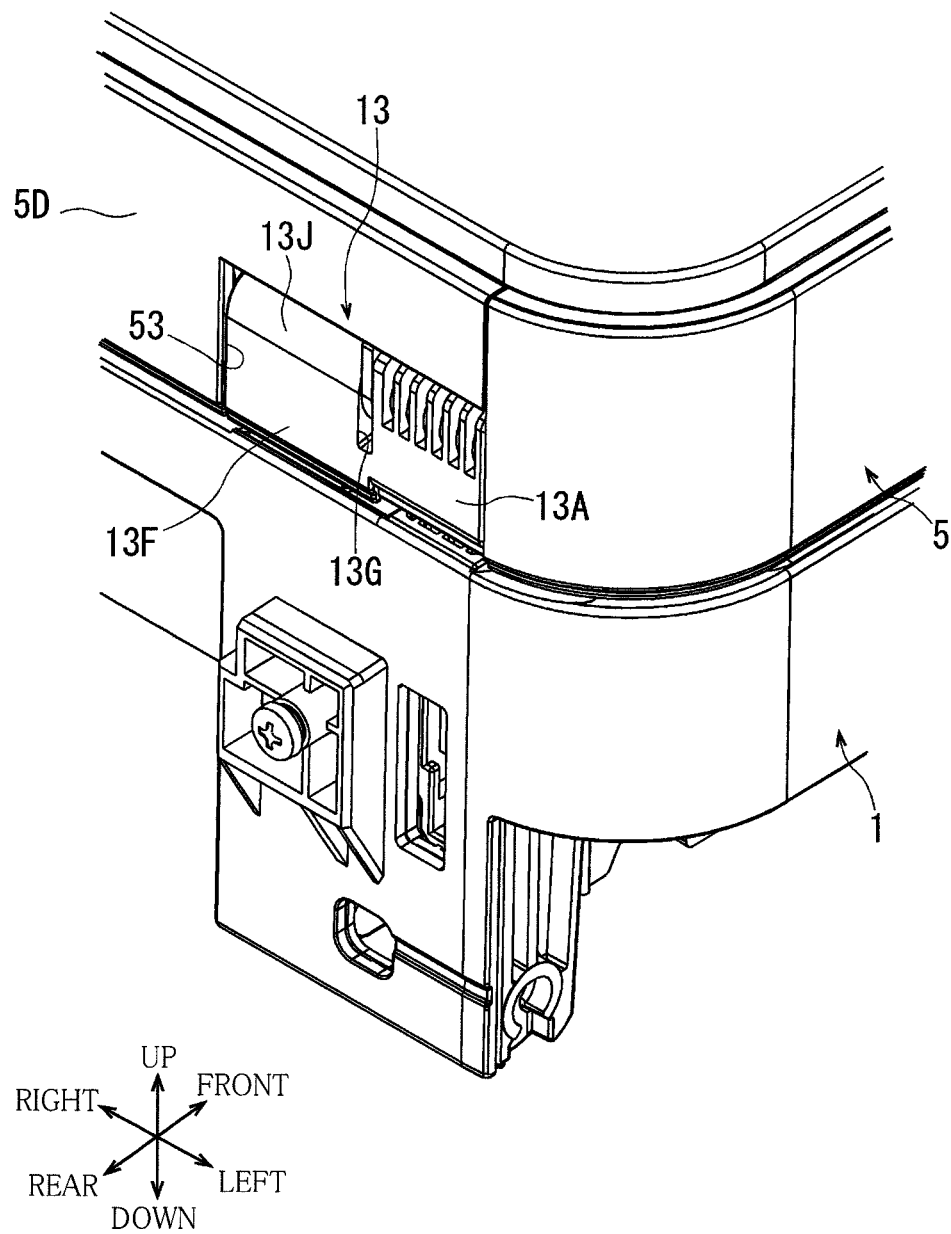
FIG. 5 is a partially enlarged view illustrating a part of FIG. 4 in which an opening, a hinge, and so on are enlarged in the MFP according to the first embodiment.
Figure 8A:
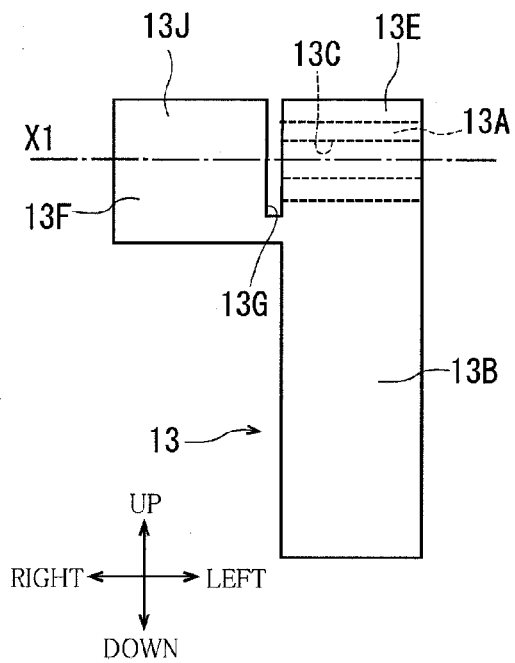
FIG. 8A is a rear view of a second hinge in the MFP according to the first embodiment.

Like the first hinge 11, as illustrated in FIGS. 5, 8, and 9, the second hinge 13 includes a shaft supporter 13A and a base portion 13B formed integrally with the shaft supporter 13A, and the shaft member 15 which will be described below. The shaft supporter 13A has a cylindrical inner peripheral surface 13C whose central axis coincides with the pivot axis X1. The shaft supporter 13A has a cutout 13D formed parallel with the pivot axis X1 for exposing the inner peripheral surface 13C to the outside. Formed on an outer circumferential surface of the shaft supporter 13A is a contact wall 13E extending in a direction parallel with the pivot axis X1 and in a direction opposite to a direction that the base portion 13B extends. When the opening and closing member 5 is moved or pivoted to an open position, the contact walls 11E, 13E are brought into contact with an inner wall 5K (illustrated in FIG. 11) of the opening and closing member 5 to position the opening and closing member 5 at the open position.

As illustrated in FIGS. 7, 9, and 11, the opening and closing member 5 includes a rear wall 5D for covering the second reading unit 6 and the motor 8 from a side thereof nearer to the first and second hinges 11, 13. The rear wall 5D is one example of a side wall. An opening 51 is formed in a portion of the rear wall 5D and a bottom wall of the opening and closing member 5 at which the first hinge 11 is disposed, and as illustrated in FIG. 7, the shaft member 15 extending parallel with the pivot axis X1 is provided in the opening 51. As illustrated in FIGS. 9 and 11, the shaft member 15 has: a cylindrical outer peripheral surface 15A whose central axis coincides with the pivot axis X1; and a pair of parallel surfaces 15B opposed to each other, with the pivot axis X1 interposed therebetween. The outer peripheral surface 15A is rotatable with respect to the inner peripheral surface 11C of the shaft supporter 11A of the first hinge 11. The pair of parallel surfaces 15B parallel with each other are parallel with the pivot axis X1. The distance between the parallel surfaces 15B is determined such that the shaft member 15 can be inserted through the cutout 11D of the shaft supporter 11A of the first hinge 11. The second hinge 13 and the opening 53 will be described below.

Figure 10:
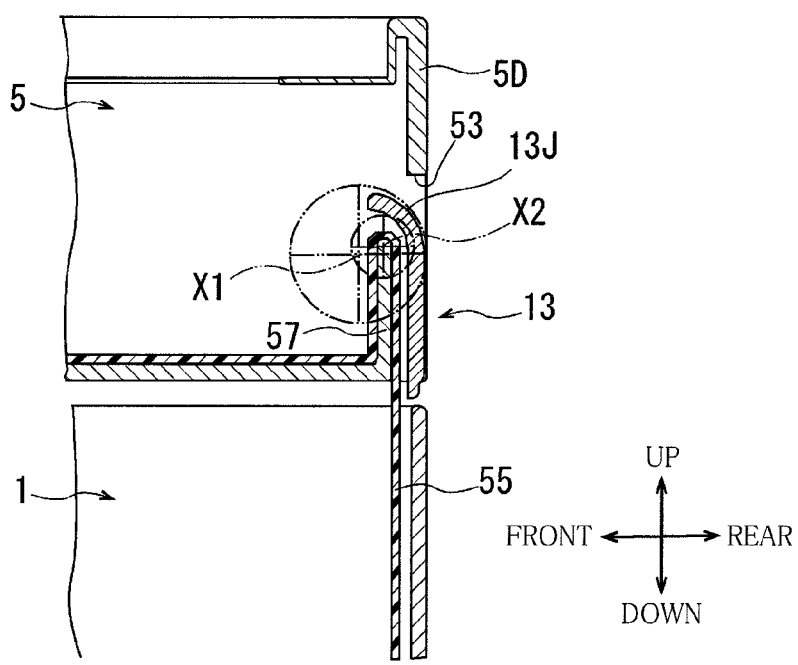
FIG. 10 is a cross-sectional view illustrating components around the cover portion in the state in which the opening and closing member is located at the closed position in the MFP according to the first embodiment.

As illustrated in FIGS. 5, 8, and 9, an opening 53 is formed in a portion of the rear wall 5D and the bottom wall at which the second hinge 13 is disposed. The opening 53 is formed, as illustrated in FIG. 9, in a portion of the rear wall 5D which is opposite the second hinge 13 in the opening and closing member 5 and, as illustrated in FIG. 10, in a portion of the rear wall 5D which is opposite the FFC 55 extending downward while supported by a support wall 57 which will be described below, in the opening and closing member 5. In other words, the opening 53 is constituted by a cutout formed from a lower edge toward an upper edge of the rear wall 5D. Like the opening 51, the shaft member 15 extending parallel with the pivot axis X1 is provided in a left portion of the opening 53. As described above, the shaft member 15 has: the cylindrical outer peripheral surface 15A whose central axis coincides with the pivot axis X1; and the pair of parallel surfaces 15B opposed to each other, with the pivot axis X1 interposed therebetween. The outer peripheral surface 15A is rotatable with respect to the inner peripheral surface 13C of the shaft supporter 13A of the second hinge 13. The pair of parallel surfaces 15B parallel with each other are parallel with the pivot axis X1. The distance between the parallel surfaces 15B is determined such that the shaft member 15 can be inserted through the cutout 13D of the shaft supporter 13A of the second hinge 13.

Figure 2:
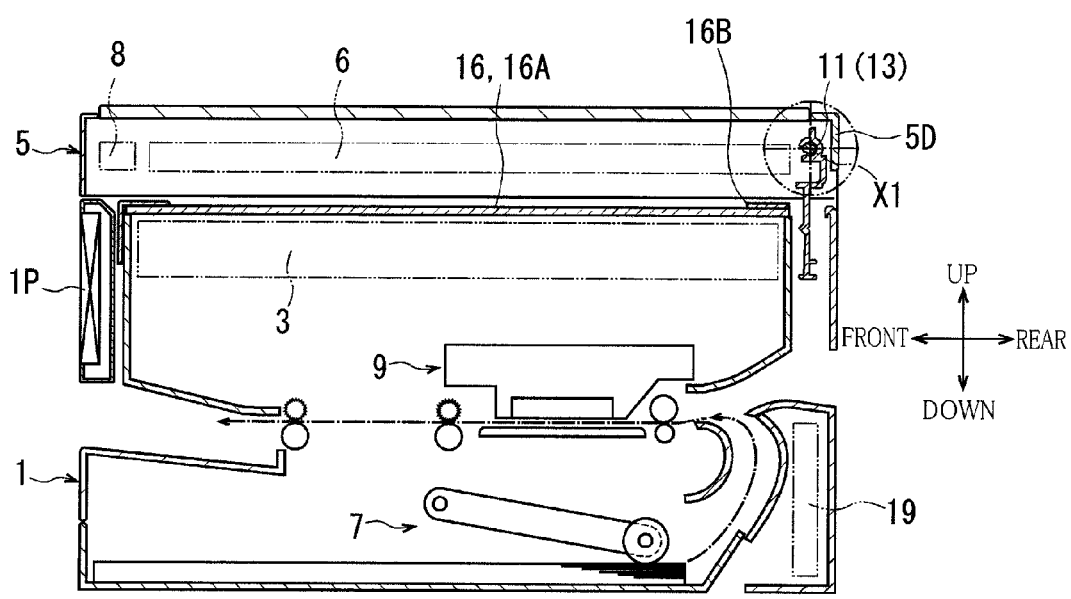
FIG. 2 is a cross-sectional view schematically illustrating the MFP according to the first embodiment.

As illustrated in FIG. 2, the conveying unit 7 is provided in the main body 1 to convey a sheet from, e.g., a sheet-supply tray. Also, the image forming unit 9 is provided in the main body 1 to form an image on the sheet conveyed by the conveying unit 7. A controller 19 is disposed in a lower rear portion of the main body 1 to control devices including the first reading unit 3, the second reading unit 6, the conveying unit 7, and the image forming unit 9.

Figure 6:
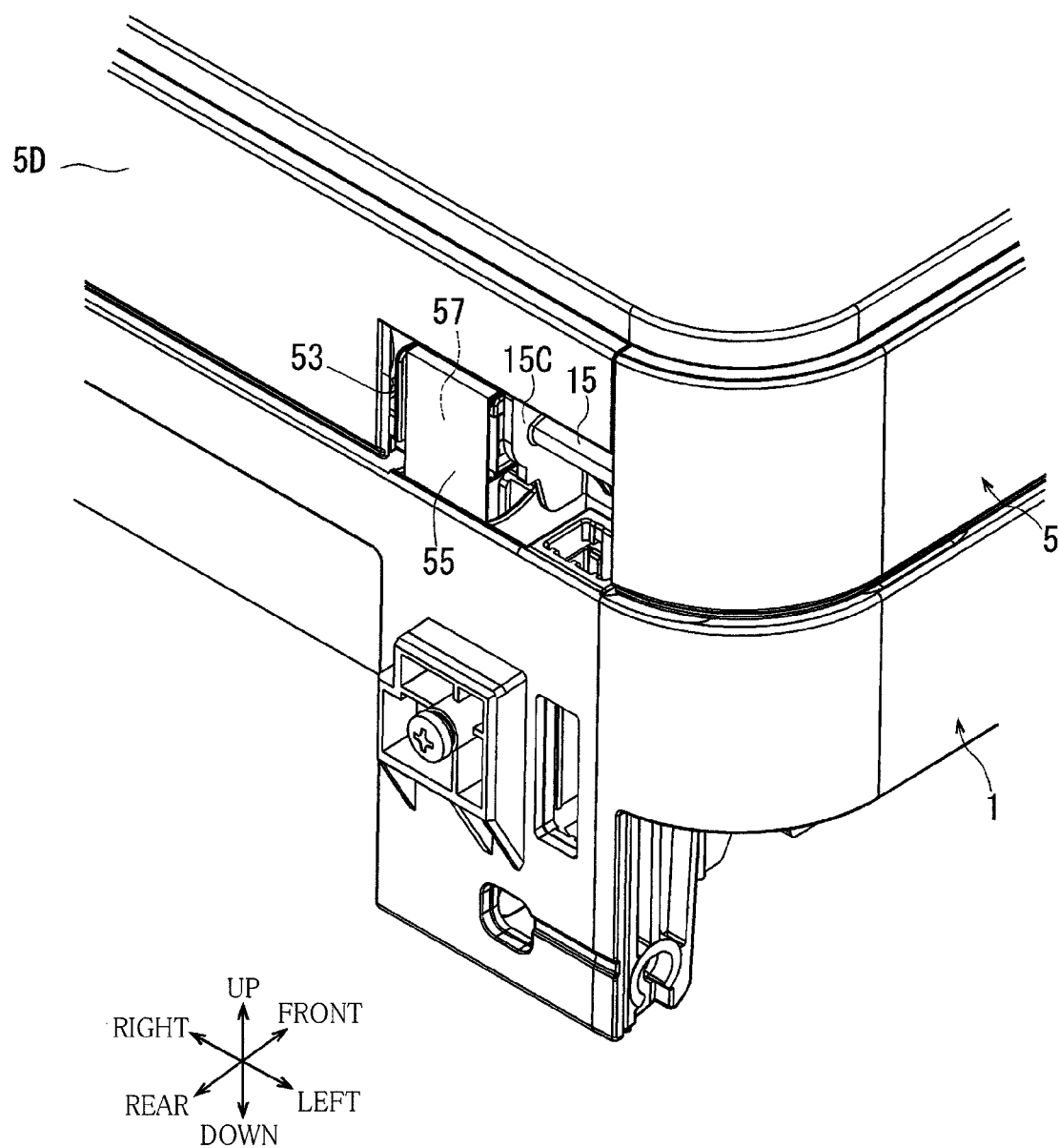
FIG. 6 is a partially enlarged view illustrating a part of FIG. 4 in which the opening, a flexible flat cable as a flexible cable, and so on are enlarged in the MFP according to the first embodiment.

As illustrated in FIGS. 5, 8A, 8B, and 9, the second hinge 13 includes a plate-like cover portion 13F disposed at a right of the shaft supporter 13A and formed integrally with the shaft supporter 13A. An outer surface of the cover portion 13F is flush with an outer surface of the shaft supporter 13A. Like the shaft supporter 13A, a curved surface 13J curved about the pivot axis X1 is formed on an upper edge portion of the cover portion 13F. As illustrated in FIG. 6, formed between the shaft supporter 13A and the cover portion 13F is a slit 13G through which a wall 15C for supporting the shaft member 15 is inserted.

The length of the opening 53 is about twice as long as that of the opening 51 in the right and left direction. The FFC 55 connected to the second reading unit 6 in the opening and closing member 5 is wired or routed rearward from the second reading unit 6, then routed along an inner surface of the rear wall 5D of the opening and closing member 5, and guided to the main body 1. The FFC 55 extends in the up and down direction in a right portion of the opening 53. As illustrated in FIGS. 3, 5, and 6, a portion of the FFC 55 which is exposed in the right portion of this opening 53 is covered with the cover portion 13F from outside. That is, the cover portion 13F is disposed at a position opposite the FFC 55 so as to cover the FFC 55 from the outside.

Figure 8B:
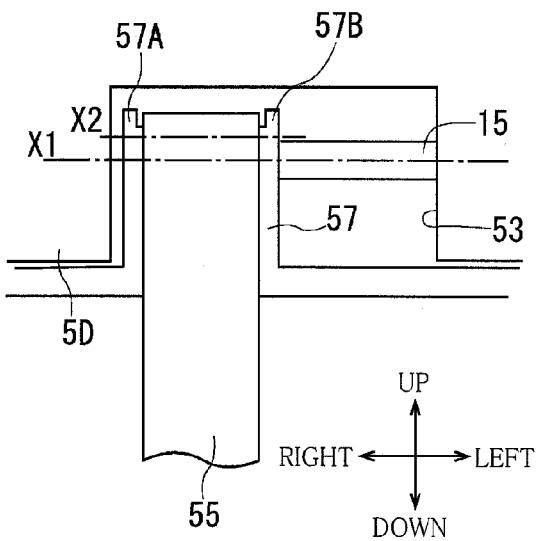
FIG. 8B is a rear view illustrating components of the opening and closing member near an opening.
Figure 12:
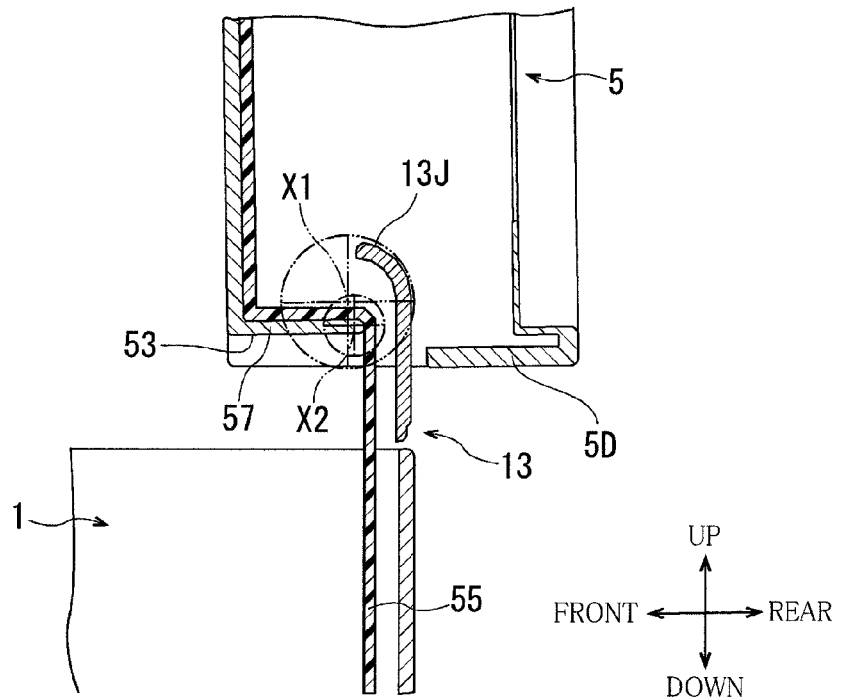
FIG. 12 is a cross-sectional view illustrating the components around the cover portion in the state in which the opening and closing member is located at the open position in the MFP according to the first embodiment.

As illustrated in FIGS. 6, 8A, 8B, 10, and 12, the support wall 57 supporting the FFC 55 is formed in the opening 53 so as to extend vertically from the bottom wall of the opening and closing member 5. An upper edge of the support wall 57 in a state in which the opening and closing member 5 is located at a closed position which will be described below is a cylindrical surface whose central axis coincides with a support axis X2. As illustrated in FIGS. 10 and 12, the support axis X2 substantially coincides with the pivot axis X1, but the support axis X2 may be located slightly on an outer (rear) side of the pivot axis X1 and parallel with the pivot axis X1. As illustrated in FIG. 8B, limiters 57A, 57B projecting upward are formed respectively on right and left end portions of the upper edge of the support wall 57. Specifically, as illustrated in FIG. 10, the FFC 55 connected to the second reading unit 6 is routed so as to extend rearward along a bottom surface of the opening and closing member 5, then extend upward, in front of the support wall 57, from the bottom wall of the opening and closing member 5, then extend over the support wall 57 between the limiters 57A, 57B while being supported on the cylindrical surface, and then extend downward toward the main body 1 on a rear side of the support wall 57. It is noted that the FFC 55 may be bonded using, e.g., a double-side tape to a facing face of the support wall 57 (e.g., a front surface of the support wall 57), preventing a positional error between the FFC 55 and the support wall 57.

Figure 13:
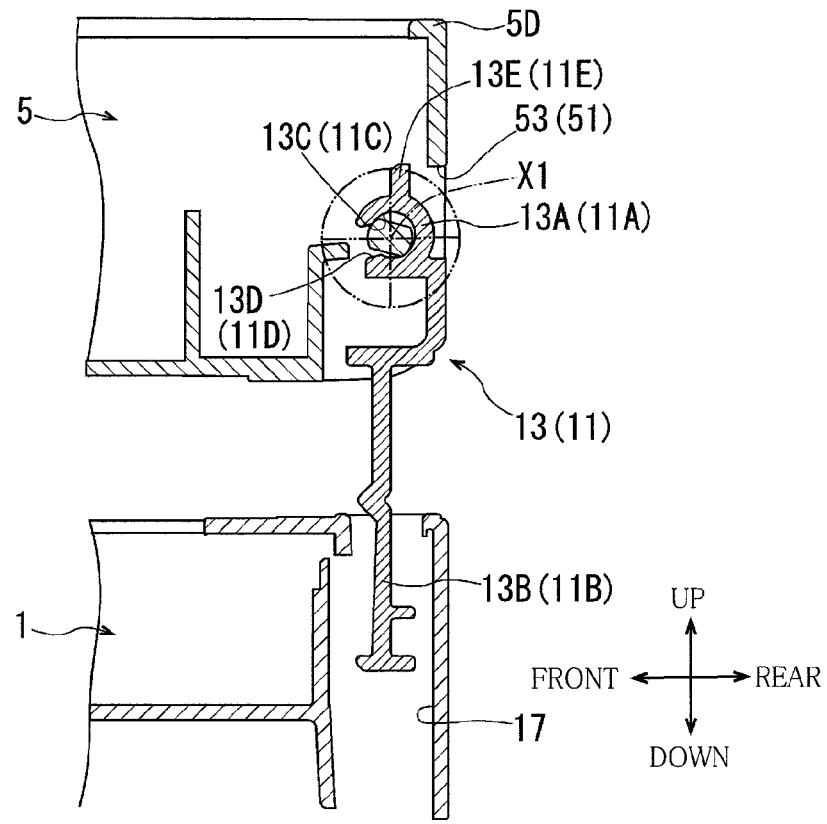
FIG. 13 is a cross-sectional view illustrating the second hinge and the components therearound in a state in which the opening and closing member at the closed position has been moved upward in the MFP according to the first embodiment.
Figure 14:
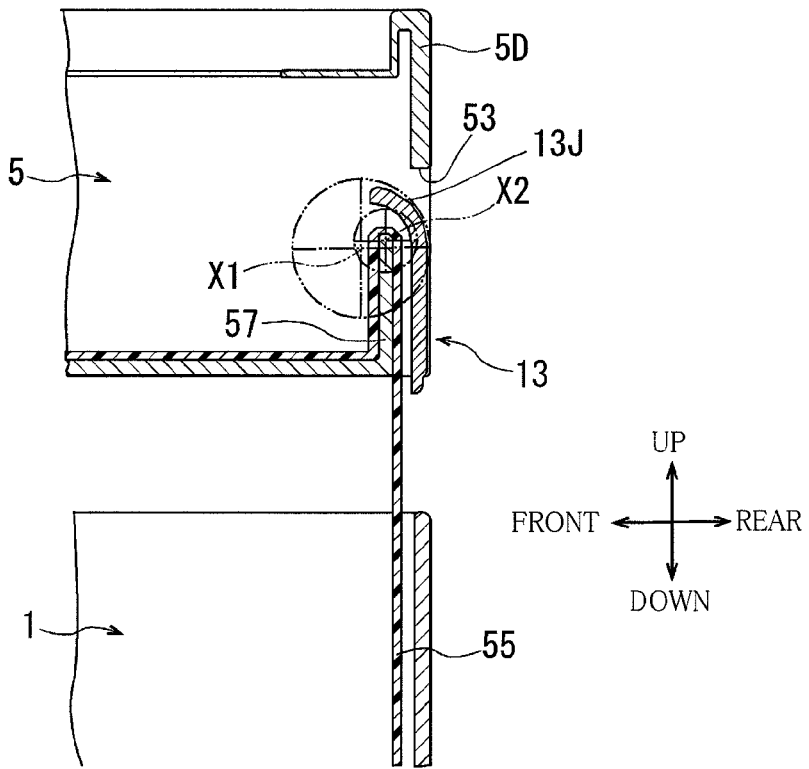
FIG. 14 is a cross-sectional view illustrating the components around the cover portion in the state in which the opening and closing member at the closed position has been moved upward in the MFP according to the first embodiment.

As illustrated in FIGS. 9 and 11, the main body 1 has an insertion hole 17 through which the base portions 11B, 13B are inserted vertically in a state in which the first and second hinges 11, 13 are disposed such that the shaft supporters 11A, 13A are located on an upper side of the respective base portions 11B, 13B, and the base portions 11B, 13B extend downward. Thus, as illustrated in FIGS. 13 and 14, the base portions 11B, 13B are mounted on the main body 1 so as to be movable in the up and down direction. Since the first and second hinges 11, 13 are thus mounted movably in the up and down direction, the opening and closing member 5 is displaceable or movable in the up and down direction. Accordingly, in a case where a relatively thick document is supported on the document support surface 16A, the first and second hinges 11, 13 are moved upward, and at this upper position the opening and closing member 5 can be moved to the position for covering the document support surface 16A.

As illustrated in FIGS. 9 and 11, each of the shaft supporters 11A, 13A of the respective first and second hinges 11, 13 partly constitutes the pivot axis X1. The first and second hinges 11, 13 allow the opening and closing member 5 to pivot between the closed position at which the opening and closing member 5 covers the document support surface 16A and the open position at which the document support surface 16A is exposed. In a case where the document is a thin sheet, for example, the opening and closing member 5 at the open position allows the document to be placed on the document support surface 16A and at the closed position covers the document from an upper side thereof. As illustrated in FIG. 13, the first and second hinges 11, 13 allow the opening and closing member 5 to move in the up and down direction between the closed position and an upper position above the closed position. The opening and closing member 5 is moved from the closed position to the upper position by being moved upward by a specific distance from the document support surface 16A. In a case where the document is a relatively thick book, for example, the opening and closing member 5 at the upper position covers the document from an upper side thereof. Accordingly, after extending over the support wall 57, the FFC 55 has slack, not shown, and the FFC 55 is connected to the controller 19 provided in the main body 1 located under the opening and closing member 5.

Here, a portion of the rear wall 5D of the opening and closing member 5 which is opposite the FFC 55 is the opening 53. Accordingly, when the opening and closing member 5 pivots between the open position and the closed position, the FFC 55 is never brought into contact with the rear wall 5D of the opening and closing member 5. Also, the portion of the FFC 55 which is exposed from the opening 53 is covered with the cover portion 13F. Also, as illustrated in FIG. 12, even when the opening and closing member 5 is moved to the open position, the second hinge 13 is not moved. Accordingly, since the cover portion 13F provided integrally with the second hinge 13 is not moved either, the cover portion 13F is located at the position where the cover portion 13F covers the portion of the FFC 55 which is exposed from the opening 53, regardless of the movement of the opening and closing member 5.

Operations

In a case where a plurality of documents are conveyed and copied in this MFP, the first and second hinges 11, 13 are used to pivot the opening and closing member 5 about the pivot axis X1 to the closed position. The documents are then set on the sheet-supply tray, not shown, provided in the opening and closing member 5, and the second reading unit 6 can read images on the documents supplied automatically from the sheet-supply tray. The first reading unit 3 provided in the main body 1 can be used to read images formed on both sides of a document at one conveyance. In the main body 1, a sheet is conveyed by the conveying unit 7, and a read image is formed on the sheet by the image forming unit 9 and discharged. Thus, copying of the document is completed.

In a case where a document is copied by this MFP without the above-described automatic supply of the document from the sheet-supply tray, the first and second hinges 11, 13 are used to pivot the opening and closing member 5 about the pivot axis X1 to the open position, and the document is placed on the document support surface 16A of the main body 1. The first and second hinges 11, 13 are then used to pivot the opening and closing member 5 about the pivot axis X1 to the closed position, allowing the first reading unit 3 to read an image formed on the document. Thus, copying of the document is completed.

In a case where a relatively thick document such as a book is copied by this MFP, the opening and closing member 5 is moved to the open position, then the document is placed on the document support surface 16A of the main body 1, and the opening and closing member 5 is moved to the upper position and the closed position. As a result, the first reading unit 3 can read an image formed on the document. Thus, copying of the document is completed.

Effects

In this MFP, the opening 53 is formed in the portion of the rear wall 5D of the opening and closing member 5 which is opposite the FFC 55. This construction may prevent the rear wall 5D of the opening and closing member 5 from contacting the FFC 55 when the opening and closing member 5 is moved between the closed position and the open position. Also, it is possible to prevent the FFC 55 from being pressed by the rear wall 5D of the opening and closing member 5 during the pivotal movement of the opening and closing member 5, preventing the FFC 55 from being pinched between the opening and closing member 5 and the main body 1. This construction allows the opening and closing member 5 to be pivoted reliably while preventing damage to the FFC 55 extending from the opening and closing member 5 toward the main body 1.

This MFP is configured such that the second hinge 13 includes the cover portion 13F, and the cover portion 13F covers the opening 53 from the outside of the FFC 55. The second hinge 13 is not displaced even when the opening and closing member 5 is pivoted, and accordingly the cover portion 13F reliably covers the FFC 55 from the outside thereof. Also, the cover portion 13F is completely separated from the opening and closing member 5, preventing the FFC 55 from being exposed from the opening 53 without preventing the pivotal movement of the opening and closing member 5. This construction also prevents ingress of foreign matters into the opening and closing member 5 through the opening 53.

As illustrated in FIGS. 10 and 12, in particular, this MFP is configured such that the opening and closing member 5 supports the FFC 55 in the opening 53 partly around the support axis X2 parallel with the pivot axis X1. Specifically, the opening and closing member 5 supports the FFC 55 in the opening 53 such that at least a portion of the FFC 55 is pivotable about the support axis X2. In this construction, since the FFC 55 is supported partly around the support axis X2 parallel with the pivot axis X1, an unnecessary load is not imposed on the FFC 55 during the pivotal movement of the opening and closing member 5, preventing the FFC 55 from being twisted and moved in the right and left direction.

Since the cover portion 13F is curved about the pivot axis X1, a space is not created between the rear wall 5D and the cover portion 13F during the pivotal movement of the opening and closing member 5, effectively preventing ingress of foreign matters into the opening and closing member 5.

Accordingly, this MFP allows the user to satisfactorily open and close the opening and closing member 5 while preventing damage to the FFC extending between the opening and closing member 5 and the main body 1.

This MFP is configured such that the opening and closing member 5 includes the support wall 57 supporting the FFC 55 partly around the support axis X2 in the opening 53, and the support axis X2 substantially coincides with the pivot axis X1. Accordingly, the simple construction of providing the support wall 57 may reliably prevent the displacement of the FFC 55 during the pivotal movement of the opening and closing member 5. Also, a part of the opening and closing member 5 is formed as the support wall 57, eliminating a need to provide another part for supporting the FFC 55.

In this MFP, the support wall 57 includes the limiters 57A, 57B, effectively preventing the FFC 55 from being moved in the direction along the support axis X2 during the pivotal movement of the opening and closing member 5.

Like the first hinge 11, the second hinge 13 includes the shaft supporter 13A having the pivot axis X1, and the cover portion 13F is formed integrally with the shaft supporter 13A, resulting in reduction in the number of components.

Second Embodiment

Figure 15:
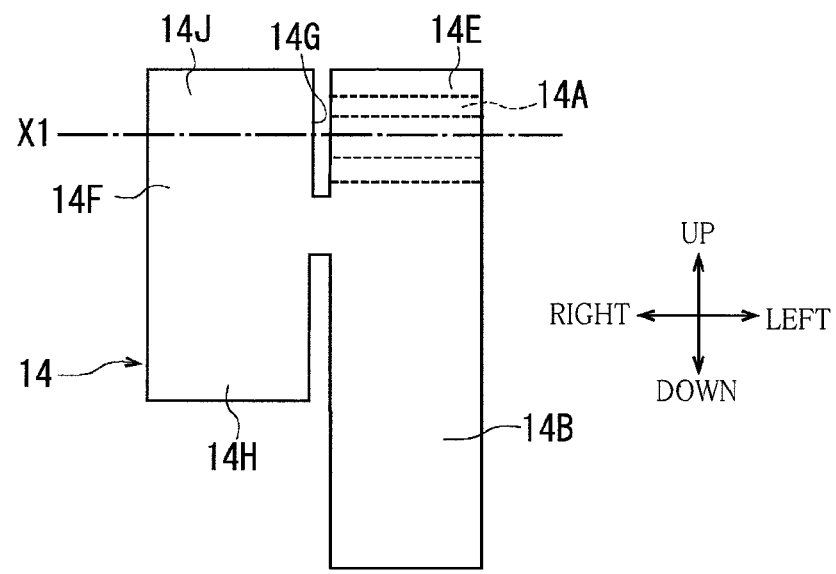
FIG. 15 is a rear view of a second hinge in an MFP according to a second embodiment.

An MFP according to a second embodiment includes a second hinge 14 illustrated in FIG. 15. Like the second hinge 13 in the first embodiment, this second hinge 14 includes a shaft supporter 14A, a base portion 14B, a contact wall 14E, a cover portion 14F, a slit 14G, and a curved surface 14J. The cover portion 14F includes an extended portion 14H formed integrally with the cover portion 14F. The other construction is similar to that of the MFP according to the first embodiment.

Figure 16:
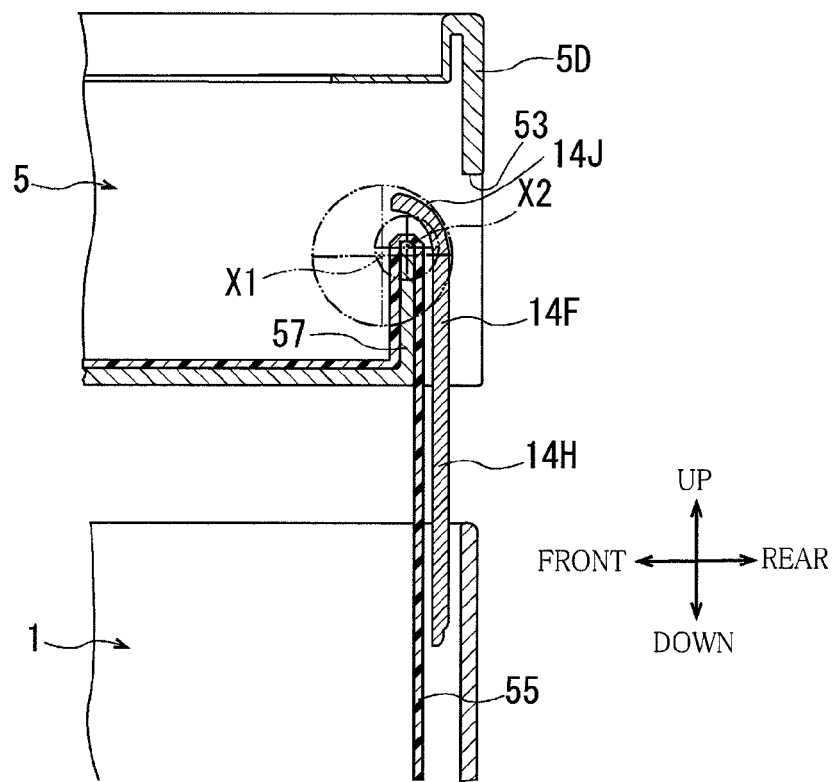
FIG. 16 is a cross-sectional view illustrating components around the cover portion in the state in which the opening and closing member at the closed position has been moved upward in the MFP according to the second embodiment.

In this MFP, as illustrated in FIG. 16, the FFC 55 moved upward by the upward movement of the second hinge 14 is covered with the extended portion 14H of the cover portion 14F from the outside. This construction prevents damage to the FFC 55 and prevents ingress of foreign matters into the main body 1 during the upward movement of the second hinge 14. The other operations and effects are similar to those of the MFP according to the first embodiment.

While the embodiments have been described above, it is to be understood that the invention is not limited to the details of the illustrated embodiments, but may be embodied with various changes and modifications, which may occur to those skilled in the art, without departing from the spirit and scope of the invention.

For example, while the FFC 55 is the flexible cable in the first and second embodiments, the similar effects can be obtained even in a case where the lead wire is assumed as the flexible cable.

The second hinges 13, 14 respectively include the cover portions 13F, 14F in the first and second embodiments. However, in a case where the FFC 55 is routed near the first hinge 11, the cover portion may be provided near the first hinge. The shape of the cover portion is not limited to the shape in the first and second embodiments.

The cover portions 13F, 14F may be formed with the respective shaft supporters 13A, 14A and may be formed independently of the respective shaft supporters 13A, 14A and fixed to the respective shaft supporters. The opening 53 may be formed in the rear wall 5D as a cutout.

The present invention is applicable to apparatuses and devices such as the MFP.

What is claimed is:

1. A sheet processing apparatus, comprising:
   a main body accommodating a controller configured to execute a processing for a sheet;
   an opening and closing member comprising an electrical part for the processing and pivotable about a pivot axis with respect to the main body between a closed position at which an upper surface of the main body is covered with the opening and closing member and an open position at which the upper surface of the main body is exposed;
   a hinge disposed between the main body and the opening and closing member and at least partly constituting the pivot axis; and
   a flexible cable connecting between the electrical part provided in the opening and closing member and the controller provided in the main body,
   the opening and closing member comprising a side wall for covering the electrical device from a hinge side of the electrical part,
   the side wall having an opening formed at a position opposite to the flexible cable extending from the opening and closing member to the main body,
   the hinge comprising a cover portion configured to cover a portion of the flexible cable which is exposed through the opening,
   wherein the opening and closing member comprises a support wall extending upward from a bottom wall of the opening and closing member in a state in which the opening and closing member is in the closed position;
   the bottom wall being positioned below the pivot axis in the state in which the opening and closing member is in the closed position,
   a position of an upper edge of the support wall substantially coincides in height with the pivot axis in the state in which the opening and closing member is in the closed position, and
   wherein the flexible cable is disposed such that the flexible cable extends along a surface of the bottom wall and a surface of the support wall.

2. The sheet processing apparatus according to claim 1, wherein the cover portion is configured to cover the portion of the flexible cable from outside at a position opposite the flexible cable.

3. The sheet processing apparatus according to claim 1, wherein the opening is formed by cutting out the side wall from a lower edge toward an upper edge of the side wall.

4. The sheet processing apparatus according to claim 1, wherein the opening and closing member is configured to support the flexible cable in the opening such that a support axis which is parallel with the pivot axis is at least partly surrounded by the flexible cable.

5. The sheet processing apparatus according to claim 4,
   wherein the support axis substantially coincides with the pivot axis, and
   wherein the opening and closing member comprises the support wall in the opening, and the support wall supports the flexible cable such that the support axis is at least partly surrounded by the flexible cable.

6. The sheet processing apparatus according to claim 1,
   wherein an upper edge of the support wall comprises a cylindrical surface configured to support the flexible cable,
   wherein an axis of the cylindrical surface coincides with a support axis which is parallel with the pivot axis, and
   wherein the flexible cable is supported by being supported by the cylindrical surface, such that the support axis is at least partly surrounded by the flexible cable.

7. The sheet processing apparatus according to claim 1, wherein the support wall comprises a stopper configured to restrain movement of the flexible cable along the support axis.

8. The sheet processing apparatus according to claim 1,
   wherein the hinge comprises: a shaft member which is pivoted together with the opening and closing member; a shaft supporter supporting the shaft member; and a base portion formed integrally with the shaft supporter and mounted on the main body so as to be movable in an up and down direction, and
   wherein the cover portion comprises an extended portion configured to cover the flexible cable moved upward by upward movement of the base portion.

9. The sheet processing apparatus according to claim 1,
   wherein the hinge comprises: a shaft member which is pivoted together with the opening and closing member; and a shaft supporter supporting the shaft member, and
   wherein the cover portion is formed integrally with the shaft supporter.

10. The sheet processing apparatus according to claim 9, wherein an outer surface of the cover portion is generally flush with an outer surface of the shaft supporter.

11. The sheet processing apparatus according to claim 1, wherein the cover portion is curved, with the pivot axis serving as an axis of the curve.

12. The sheet processing apparatus according to claim 1, wherein the electrical part is a reading unit configured to read an image formed on the sheet.

* * * * *